United States Patent [19]
Szczyrbowski et al.

[11] Patent Number: 5,807,470
[45] Date of Patent: Sep. 15, 1998

[54] APPARATUS FOR COATING SUBSTRATES IN A VACUUM

[75] Inventors: Joachim Szczyrbowski, Goldbach; Götz Teschner, Hanau, both of Germany

[73] Assignee: Balzers Und Leybold Deutschland Holding AG, Hanau am Main, Germany

[21] Appl. No.: 690,835

[22] Filed: Aug. 1, 1996

[30] Foreign Application Priority Data

Oct. 6, 1995 [DE] Germany ............... 195 37 212.3

[51] Int. Cl.⁶ .................................................. C23C 14/34
[52] U.S. Cl. ........................ 204/298.08; 204/192.12
[58] Field of Search .................. 204/298.08, 192.12, 204/298.26

[56] References Cited

U.S. PATENT DOCUMENTS

| | | |
|---|---|---|
| 4,887,005 | 12/1989 | Rough et al. ............. 315/111.21 |
| 4,956,070 | 9/1990 | Nakada et al. ............. 204/298.18 |
| 5,082,546 | 1/1992 | Szczyrbowski et al. ...... 204/298.08 |
| 5,140,223 | 8/1992 | Gesche et al. ............. 315/111.21 |
| 5,169,509 | 12/1992 | Latz et al. ............... 204/298.03 |
| 5,240,584 | 8/1993 | Szczyrbowski et al. ...... 204/298.08 |
| 5,281,321 | 1/1994 | Stürmer et al. ............ 204/298.08 |
| 5,399,252 | 3/1995 | Scherer et al. ............ 204/298.19 |
| 5,415,757 | 5/1995 | Szczyrbowski et al. ...... 204/298.08 |
| 5,512,164 | 4/1996 | Timberlake ................ 205/186 |

*Primary Examiner*—Nam Nguyen
*Attorney, Agent, or Firm*—Felfe & Lynch

[57] ABSTRACT

An alternating-current source (2) is connected to two cathodes (6,7) which cooperate electrically with targets which are sputtered in a gas discharge while a process gas is introduced in a vacuum chamber (15). A network formed of a transformer (3) and additional coils (5, 12, 13) and condensers (4, 8, 9, 10, 11) acts as a filter to assure a stable coating process.

6 Claims, 2 Drawing Sheets

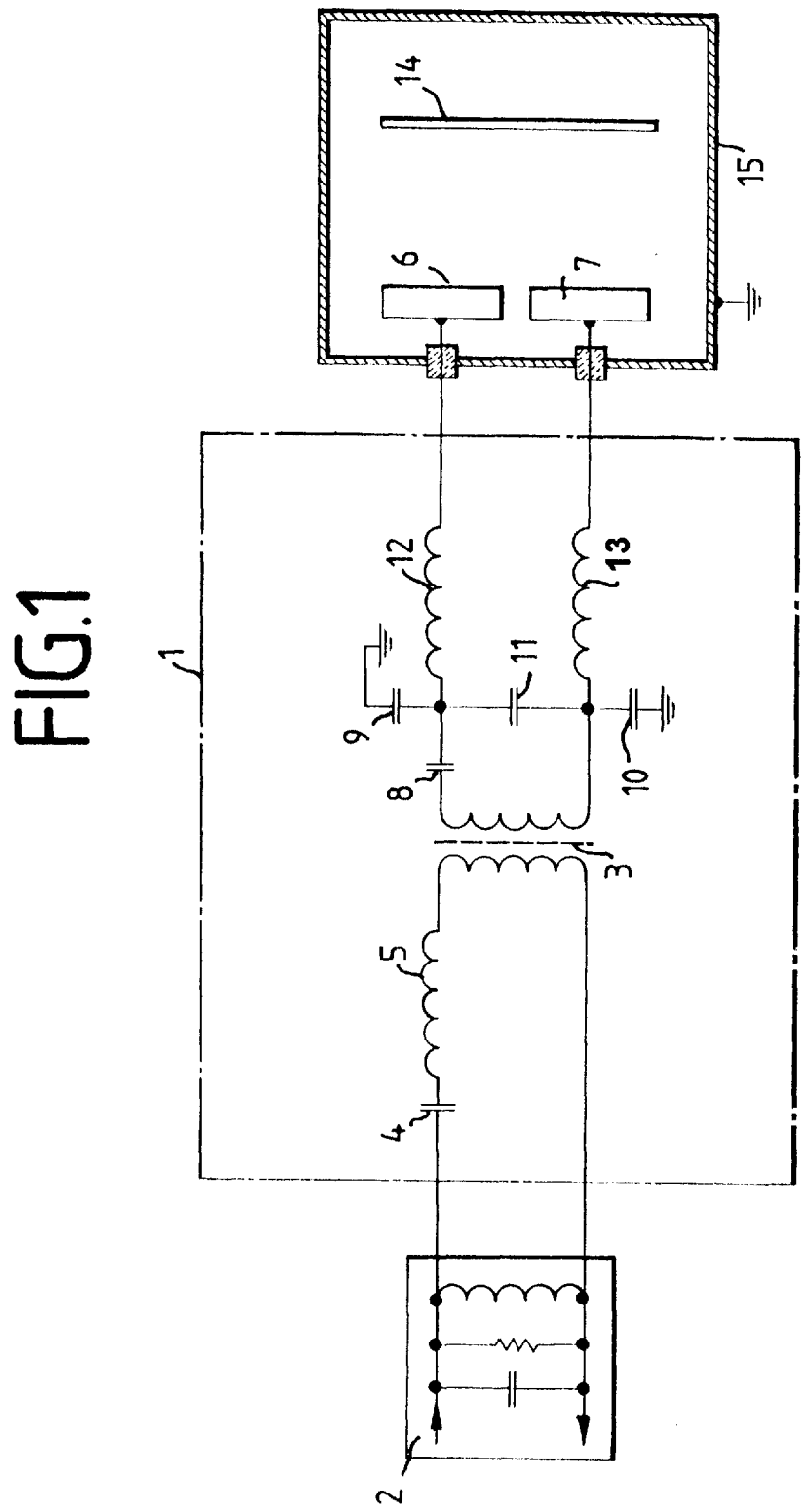

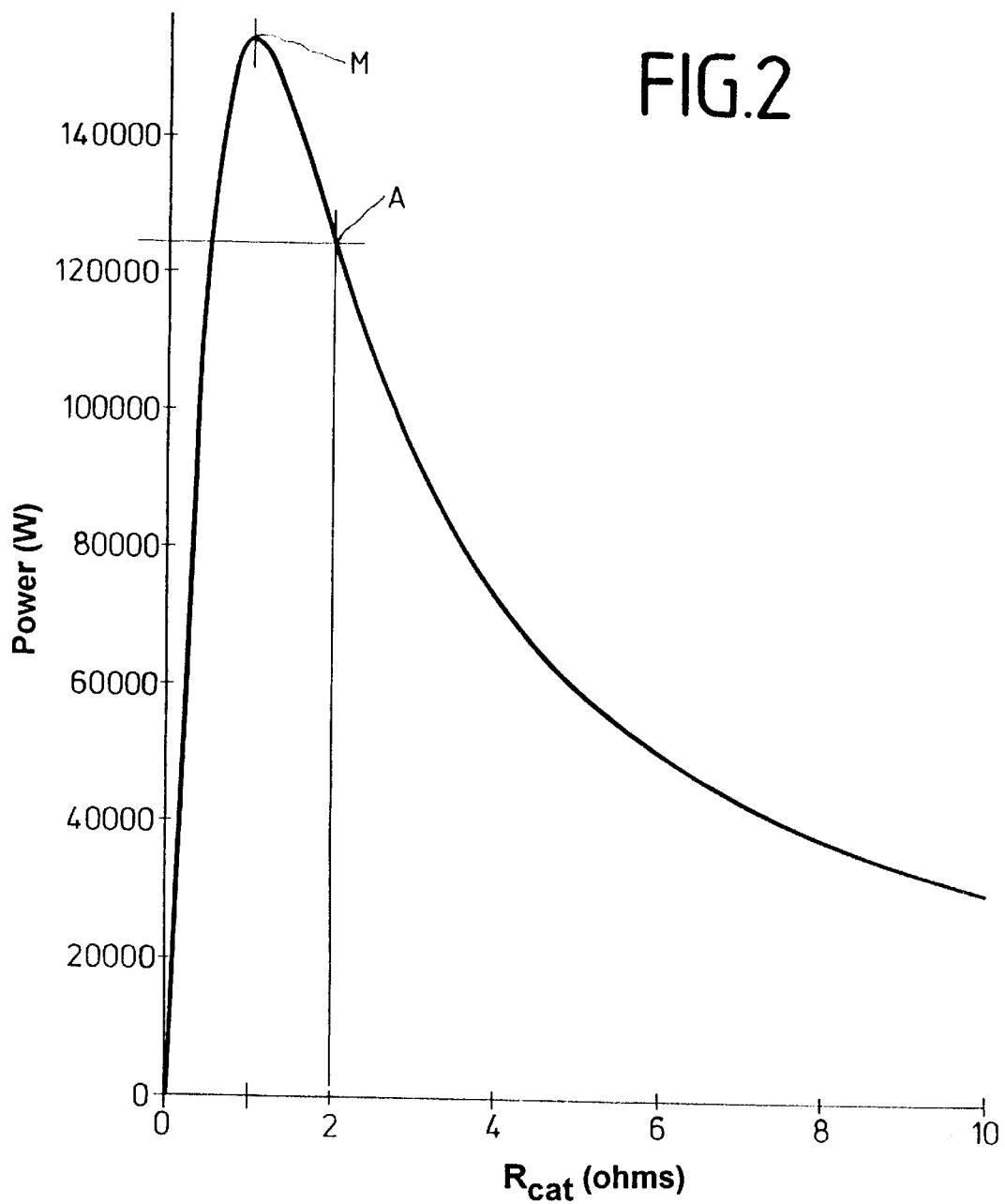

APPARATUS FOR COATING SUBSTRATES IN A VACUUM

BACKGROUND OF THE INVENTION

The invention relates to an apparatus for coating substrates in a vacuum, consisting of an alternating-current source which is connected to two cathodes disposed in an evacuable coating chamber, which cooperate electrically with targets which are to be sputtered, and whose sputtered particles deposit themselves on the substrate, while a process gas can be supplied the coating chamber and between the alternating-current source and the cathode pair a network is disposed which acts as a filter and is formed of a transformer, coils, and condensers.

A sputtering apparatus is already known for producing thin coatings (DD 252 205), consisting of a magnet system and at least two electrodes of the material to be sputtered arranged over them, these electrodes being connected electrically so that they are alternately cathode and anode of a gas discharge. The electrodes are for this purpose connected to a sinusoidal alternating voltage of preferably 50 Hz.

This known sputtering apparatus is suitable especially for depositing dielectric coatings by reactive sputtering. Operating the apparatus at about 50 Hz is intended to prevent the formation of flakes on the anode and, in the case of metallic coating, resulting in electrical short-circuits (known as arcing).

DE 39 12 572 discloses an apparatus for applying thin films by sputtering, wherein the rate at which layers of different materials are deposited is controllable. In order to achieve thin packets of layers, at least thin different kinds of counter-electrodes are provided on the cathode side. U.S. Pat. No. 5,169,509 discloses a method and an apparatus for the reactive coating of a substrate with an electrically insulating material, silicon dioxide ($SiO_2$) for example, consisting of an alternating-current source, which is connected to magnetron cathodes in a coating chamber. Two non-grounded outputs of the alternating-current source are each connected with a cathode bearing a target, each target approximately the same distance away from the opposite substrate. The effective value of the discharge voltage is measured by an effective-voltage detector and fed as direct current through a conductor which by means of a control valve directs the reactive gas flow from the container to the distribution line such that the measured voltage will agree with a set voltage.

U.S. Pat. No. 5,240,584 discloses an apparatus for the reactive coating of a substrate in which a magnetron cathode is electrically separated from the vacuum chamber and has two parts electrically separated from one another. The target base body with yoke and magnets as the one part—with the insertion of a capacitor—is connected to the negative pole of a direct-current voltage supply. The target is connected as the other part through a choke and a parallel resistance and through a capacitor to the positive pole of the power supply, and through a resistor to an anode at ground potential. In series with the low-induction capacitor an inductance is inserted in the branch line to the resistor and to the choke, and the value of the resistance is typically between 2,000 ohms and 10,000 ohms. This known apparatus is so constructed that it suppresses a predominant number of the arcs occurring during a coating process, and reduces the energy of the arcs and improves the reignition of the plasma after an arc.

The practicality of a sputtering process stands and falls with the stability of the process. That is, the system must be stable over long periods of time (300 h) and assure the electrical requirement (cathode current, power) and the optical properties of the coating (index of refraction, thickness, and thickness distribution).

The greater the length of a cathode becomes, the greater becomes the power required and the more difficult it becomes to satisfy the stability requirements. This has determined the physical background, that the voltage is determined by pressure, kind of gas, and the quality of the target surface, while the current increases in proportion to the length. Small changes in the quality of the target surface produce small voltage variations which, however, multiplied by the high current resulting from the great cathode length, lead to high power fluctuations, which can be so great that the target can melt locally.

It is especially problematic to maintain the degree of oxidation of the deposited coating at high powers. This problem is the result of the fact that, for the large surface coating of architectural glass, oxides, among other things, are deposited when sputtering of a metal target is performed with an oxygen-argon mixture in order to obtain a particular oxide modification. This oxide modification is needed in order, for example, to set the color of the coating system or the corrosion resistance.

If the supply of the oxygen is increased, the cathode tilts to the oxide mode. If the oxygen content is increased only above the tilt point, then the cathode can be brought back into the metal mode by increasing the power.

Two basic ways are known for the cathodes to perform:
Type 1: The resistance of the cathodes decreases with increasing reactive gas content.
Type 2: The resistance of the cathodes increases with increasing reactive gas content.

Which type is present depends on the material and on the kind of reactive gas.

Most applications use as the "working point" a ratio of oxygen content to power that is close to the "tilt point". The reason for this is that in this range the highest oxide coating rates are achieved. For the operation of the system this working point is very unfavorable, because slight fluctuations in power, oxygen, or the cathode environment can lead to a change in the mode so that product rejects result.

As the cathode becomes larger, the power fluctuations greatly increase and the room for stable operation of the cathodes becomes less, so that without additional means, large cathodes for demanding materials such as Si and $SiO_2$ can no longer be used at all.

SUMMARY OF THE INVENTION

According to the invention, a network which acts as a filter is provided between the alternating-current source and the cathode pair. The network includes a transformer and additional coils and condensers, and the frequency of the alternating-current source differs from any natural frequency of the filter. The curve of the cathode power as a function of the cathode resistance which the gas discharge offers to the alternating current has a maximum, while the resistance at the maximum is selected such that the cathode resistance at the working point differs from the resistance at the maximum, and the impedance of the network opposes change from one process state to the other.

The network stabilizes the system so that reliable operation is assumed even at high powers.

BRIEF DESCRIPTION OF THE DRAWINGS

FIG. 1 is a schematic diagram of the power supply for the cathode pair, and

FIG. 2 is a graph of the power over the resistance.

The apparatus herein is for sputtering a substrate 14 in an evacuable coating chamber 15.

DETAILED DESCRIPTION OF THE PREFERRED EMBODIMENT

The energy is obtained from the medium-frequency generator 2 at its resonant circuit. Since due to its construction this circuit is electrically connected to the supply line, an isolating transformer 3 must be included in the network 1. At what point in the network the transformer 3 is inserted is of no importance from here on.

Condenser 4 and coil 5 are disposed on the resonant-circuit side of the transformer, and the rest of the components are disposed on the side of the cathodes 6 and 7. Also successfully tried was a circuit in which the transformer 3 was connected directly to the resonant circuit 2 and all condensers and coils were arranged on the cathode side.

The size of condenser 8 is selected to be so great that it has little effect on the frequency characteristic of the circuit. It serves to protect the transformer 3 against any direct current which might flow which due to differences in the characteristics of the two cathodes 6 and 7 and thus might impair the operation of the transformer 3.

In case the transformer is directly connected to the resonant circuit, the condenser 4 can take over the function of condenser 8.

The condensers 9 and 10 serve for arc suppression, by grounding currents of very high frequency. These very high frequency currents can also be produced by switching operations in the plasma.

The actual characteristic made possible by the self-stabilization is established by the condensers 4 and 11 as well as the coils 5 and 12 and 13. Formally, coils 12 and 13 can be combined to form one coil. Assembly of coils 12 and 13 of the same size is done in order to obtain good symmetry in the system as a whole.

1. The reference value for the calculation is the equivalent resistance of the sputtering section, designated $R_{cat}$ in the following text. It is formed as the quotient of the effective value $V_{cat}$ of the voltage between the cathodes 6 and 7 at the instantaneous power and the effective value of the cathode current $I_{cat}$ at the power in this moment, $R_{cat}=V_{cat}/I_{cat}$.
2. The self-stabilization is obtained with cathodes with Type 1 behavior if, in the case of decreasing resistance $R_{cat}$, the power in cathodes 6 and 7 increases. To provide sufficient leeway for stabilization in the production process the resistance $R_{max}$ is selected at which the maximum power (M) is reached, and thus the end of the self-stabilization, at $R_{max}'=0.5 \ldots 0.75 \times R_{cat}$ at the rated power. See FIG. 2 with the working point (A) at the rated power.
3. At the working frequency the input resistance of the network 1 must be inductive, measured on the cathode side.
4. The input resistance $R_{in}$ of the network 1 is great in comparison to $R_{max}$, and decreases now to a minimum (1st null point) at a frequency below the working frequency.
5. At the working frequency the input resistance $R_{in}$ reaches a value of $1.414 \times R_{max}$, i.e., the imaginary part and the real part of the input resistance $R_{in}$ are equal to $R_{max}$.
6. As the frequency increases further, the input resistance $R_{in}$ rises to a maximum and then decreases to a 2nd minimum (2nd null point). The frequency of this 2nd null point is approximately three times the working frequency.

Practical values for the components are:

Working frequency: 40 kHz

C1 (capacitor 4) =0.6 μF, C2 (capacitor 8)=18 μF, C3 (capacitor 11)=108 nF, C4 (capacitor 9)=8 nF, C5 (capacitor 10)=8 nF L1 (coil 5)=16 μH, L2 (coil 12)-L3 (coil 13)=23 μH Transformer ratio: 1:2.

The equivalent resistance $R_{cat}$ of the sputtering section at a rated power of 125 kw amounts to 2 ohms in the mentioned example (FIG. 2); the resistance $R_{max}$ at maximum power amounts to 1 ohm.

The power can be calculated as a function of the equivalent resistance according to Kirchoff's rules for circuit analysis to yield $$P(R_{cat})=R_{cat}/(b_o+b_2R_{cat}^2)$$

wherein $b_o$ is the linear component of the filter and $b_2$ is the component representing all values which are combined with $R_{cat}^2$.

We claim:

1. An apparatus for coating a substrate, said apparatus comprising:

an evacuable coating chamber having means for introducing a process gas therein, said chamber supporting therein two cathodes and said substrate to be coated;

an alternating current source providing alternating current having a frequency;

a network connected with the alternating current source and receiving said alternating current therefrom, said network transmitting to said cathodes cathode power derived from said alternating current, the network having one or more natural frequencies, all of said natural frequencies of the network being different from the frequency of the alternating current from the alternating current source;

said cathodes cooperating electrically with targets so that sputtered particles of said target are deposited on the substrate while the process gas is supplied to the coating chamber;

the process gas and said cathode power resulting in a cathode resistance $R_{cat}$ between said cathodes; and during said deposition, said cathodes having a maximum power level which can be applied thereto, at which maximum power level a corresponding resistance $R_{max}$ exists between said cathodes;

the network transmitting the cathode power at a working point power level selected such that the cathode resistance $R_{cat}$ at the working point power level for the apparatus is different from the cathode resistance $R_{max}$ at said maximum power level; and the network having an impedance opposing change of the cathode power away from said working point power level.

2. The apparatus according to claim 1, wherein the cathode power is related to the cathode resistance $R_{cat}$ according to the expression $$\text{cathode power}=R_{cat}/(b_o+b_2R_{cat}^2)$$

wherein $b_o$ and $b_2$ constants.

3. The apparatus according to claim 1 wherein the cathode resistance $R_{cat}$ at the working point level is approximately two times the resistance $R_{max}$.

4. The apparatus according to claim 1 wherein the impedance of the network measured from the cathodes is inductive.

5. The apparatus according to claim 1 wherein the cathode resistance in all process states of the cathodes is greater than the resistance $R_{max}$ at the maximum power level.

6. The apparatus of claim 1, wherein said working point power level is selected such that the cathode resistance $R_{cat}$ at the working point power level for the apparatus is greater than the cathode resistance $R_{max}$ at said maximum power level, and the network impedance opposing increase of the cathode power above said working point power level.

\* \* \* \* \*

UNITED STATES PATENT AND TRADEMARK OFFICE
CERTIFICATE OF CORRECTION

PATENT NO. : 5,807,470
DATED : September 15, 1998
INVENTOR(S) : Szczyrbowski et al.

It is certified that error appears in the above-identified patent and that said Letters Patent is hereby corrected as shown below:

Column 1,
Line 11, after "supplied" add -- to --.

Column 2,
Line 2, change "requirement" to -- requirements --.
Line 26, after "only" add -- slightly --.

Column 4,
Line 64, after "$b_2$" add -- are --.

Signed and Sealed this

First Day of March, 2005

JON W. DUDAS
*Director of the United States Patent and Trademark Office*